United States Patent
Bhan et al.

(10) Patent No.: US 6,319,728 B1
(45) Date of Patent: Nov. 20, 2001

(54) METHOD FOR TREATING A DEPOSITED FILM FOR RESISTIVITY REDUCTION

(75) Inventors: Mohan K. Bhan, Cupertino; Ling Chen, Sunnyvale; Bo Zheng, San Jose; Justin Jones, San Francisco; Seshadri Ganguli; Timothy Levine, both of Santa Clara; Samuel Wilson, Sunnyvale; Mei Chang, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/092,477

(22) Filed: Jun. 5, 1998

(51) Int. Cl.[7] .................................................... H01L 21/44
(52) U.S. Cl. ........................... 436/687; 438/680; 438/681
(58) Field of Search .................................. 438/687, 680, 438/681

(56) References Cited

U.S. PATENT DOCUMENTS

| | | | |
|---|---|---|---|
| 5,141,613 | 8/1992 | Adoncecchi et al. | 204/192.1 |
| 5,296,404 | 3/1994 | Akahori et al. | 437/173 |
| 5,561,082 * | 10/1996 | Matsuo et al. | 438/687 |
| 5,593,511 | 1/1997 | Foster et al. | 148/238 |
| 5,744,192 * | 4/1998 | Nguyen et al. | 438/687 |
| 5,918,150 * | 6/1999 | Nguyen et al. | 438/687 |

FOREIGN PATENT DOCUMENTS

| | | | |
|---|---|---|---|
| 0 818 560 A2 | 1/1998 | (EP) | C23C/16/56 |
| 10116831 | 5/1998 | (JP) | H01L/21/3205 |

OTHER PUBLICATIONS

Gelatos et al., "Chemical Vapor Deposition of Copper from $Cu^{+1}$ Precursors in the Presence of Water Vapor" Applied Physics Letter, vol. 63, No. 20, Nov. 15,1993.

J. Norman, D. Roberts, A. Hochberg, P. Smith, G. Petersen,J. Parmeter,C.Apblett, T. Omstead, "Chemical Additives for Improved Copper Chemical Vapour Deposition Processing", Thin Solid Films 262 (1995) pp. 46–51.

C. Marcadal,E.Richard,J. Mermet, J. Torres,J. Palleau,B. Alaux, M. Bakli, "Cu–CVD Process Optimised in a Cluster Equipment for IC Manufacturing:", Microelectronic Engineering 33 (1997) pp. 3–13.

* cited by examiner

Primary Examiner—Caridad Everhart
(74) Attorney, Agent, or Firm—Moser, Patterson & Sheridan, L.L.P.

(57) ABSTRACT

A method for reducing the resistivity of a copper layer on a wafer. A moisture containing seed layer of copper is formed over a layer of material on a wafer. The copper seed layer is treated by either heat or ions from a plasma to anneal out moisture thereby reducing its resistivity and improving its adhesion to the underlying layer. A moisture free copper layer is then deposited on top of the "clean" or treated copper seed layer.

16 Claims, 5 Drawing Sheets

| WAFER# | NUCLEATION LAYER | COOL DOWN | ANNEAL@450C/10MIN | H2 PLAS TREAT@450C | BULK Cu DEP W/O H2O | POST ANNEAL@450C |
|---|---|---|---|---|---|---|
| 1 | H2O:26SCCM P:0.5T DT:30 SEC. | 10 MIN. | NO | NO | P:0.5 TORR DT:150 SEC | NO |
| 2 | | NO | NO | 60 SEC | | NO |
| 3 | | NO | 10 MIN | NO | | NO |
| 4 | | NO | NO | 15 SEC | | NO |
| 5 | | PUMPDOWN:120 SEC | NO | NO | | 5 MIN. |

| WAFER# | THICKNESS (A) | Rs(OHM/SQ.) | RESISTIVITY | ADHESION | BREAKING STRESS(KPSI) |
|---|---|---|---|---|---|
| 1 | 1425 | 0.189 | 2.69325 | 4,3,9,3,3,3,8 | 8.6 |
| 2 | 1537 | 0.1197 | 1.839789 | 4,3,8,3,5,4,3,8 | 9.2 |
| 3 | 1526 | 0.145 | 2.2127 | 4,4,4,4, | 8.9 |
| 4 | 1340 | 0.186 | 2.4924 | 4,3,3,4,3 | 9.3 |
| 5 | 2750 | 0.0763 | 2.09825 | 1,3,1,3,3 | 3.5 |

FIG.5

METHOD FOR TREATING A DEPOSITED FILM FOR RESISTIVITY REDUCTION

BACKGROUND OF THE INVENTION

1. Field of the Invention

The present invention is directed toward the field of manufacturing integrated circuits. The invention is more particularly directed toward treating deposited thin films that form integrated circuits to improve their electrical characteristics.

2. Description of the Related Art

Presently, aluminum is widely employed in integrated circuits as an interconnect, such as plugs and wires. However, higher device densities, faster operating frequencies, and larger die sizes have created a need for a metal with lower resistivity than aluminum to be used in interconnect structures. The lower resistivity of copper makes it an attractive candidate for replacing aluminum. One challenge in employing copper instead of aluminum is the fact that copper does not adhere well to materials, such as titanium nitride, that are presently being used as diffusion barriers beneath the copper. Diffusion barriers are deposited between layers of the devices to prevent cross-contamination. For example, material from a conducting layer can migrate into neighboring insulating layers thereby compromising the intended insulative characteristic. Such a condition can lead to shorting or performance degradation of the device. Poor adhesion of the copper to a diffusion barrier results in portions of the copper being undesirably peeled away during polishing. This condition can also render an integrated circuit defective.

One solution to improve the adhesion of copper to an underlying diffusion barrier is to divide the process for depositing copper into two steps. During a first step, physical vapor deposition (PVD) is performed to deposit a seed layer of copper. PVD is a well established technique for depositing material to create thin films. Once the seed layer of copper is deposited using PVD, a bulk layer of copper is deposited. The bulk layer is deposited by either standard chemical vapor deposition (CVD) or electrical plating. The bulk layer of copper adheres relatively well to the copper seed layer.

Unfortunately, the use of the PVD process results in poor step coverage, which is unacceptable for devices that have a high aspect ratio (the ratio of the depth of a feature to its cross sectional width on the substrate surface). Further, the PVD process cannot be accomplished in the same chamber as either chemical vapor deposition or electrical plating. The need to have both a PVD chamber and either a CVD or electrical plating chamber increases integrated circuit manufacturing costs and reduces throughput (the number of substrates processed per unit of time). Alternately, adhesion can be improved by treatment of the seed layer by bombardment with ions prior to bulk deposition of CVD copper. However such thin films have an undesirably high electrical resistivity. Therefore, it is therefore desirable to employ chemical vapor deposition, for depositing both the seed and bulk layers, because CVD provides for a more conformal layer of copper.

The chemical vapor deposition of copper presents a further challenge. The challenge arises from a byproduct that is produced during the deposition of the copper. In one instance, the chemical vapor deposition of copper is achieved by using a precursor known as Cupraselect, which has the formula Cu(hfac)L. The L represents a Lewis base compound, such as vinyltrimethylsilane (VTMS). The (hfac) represents hexafluoroacetylacetonato, and Cu represents copper. During the CVD of copper using the Cu(hfac)L precursor, the precursor is vaporized and flowed into a deposition chamber containing a substrate (i.e. a semiconductor wafer). In the chamber, the precursor is infused with thermal energy at the wafer's surface, and the following reaction results:

$$2Cu(hfac)L \rightarrow Cu + Cu(hfac)_2 + 2L \qquad (Eqn. 1)$$

The resulting copper (Cu) deposits on the upper surface of the wafer, along with the Cu(hfac)$_2$ byproduct. The gaseous Lewis base byproduct (2L) is purged from the chamber. The presence of the byproduct as well as other contaminants on the wafer's surface increases the resistivity of the copper to an underlying diffusion barrier, such as titanium or tantalum nitride. Post annealing after deposition of the final layer of copper reduces the resistivity further but also degrades the adhesion. Consequently, a post annealing step is not entirely advantageous to formation of copper films.

Adding moisture (H$_2$O) during the deposition of the seed layer by CVD increases the deposition rate which is highly desirable. Unfortunately, the addition of H$_2$O also produces contamination from excessive oxygen (O$_2$) which reacts with the copper forming copper oxide (CuO). The CuO incorporated into the seed layer increases the resistivity of the resulting film to an undesirable level. Further, a bulk layer of copper will not adhere well to a CuO interface.

Accordingly, it is desirable to provide a method for the treatment of moisture laden copper CVD layers so that the adhesion between the copper and the underlying diffusion barrier is strong and the electrical resistivity is reduced. It is also desirable for such a deposition to be performed in a single chamber (in situ).

SUMMARY OF THE INVENTION

In accordance with the present invention, a layer of material, such as copper, is formed on the surface of a wafer with reduced resistivity. In forming the layer of copper, a copper seed layer containing moisture (H$_2$O) is first deposited by CVD on a surface of the wafer. Once the seed layer is deposited, the copper (containing moisture) is annealed by treatment with energy to reduce the resistivity of the copper on the surface of the wafer. The energy for annealing can be provided, for example, in the form of heat or bombardment with ions. A bulk layer of copper is subsequently deposited by CVD. To lower the resistivity of the copper bulk film without any post treatment, by heat or ion bombardment, it is essential to deposit the bulk copper layer in a moisture free chamber.

If the energy is supplied in the form of heat, any conventional heat source may be used. For example, the heat may be supplied by a resistive heating element, induction coil, radiant heat lamp or the like. A reducing agent such as hydrogen gas is also with the heat to remove the contaminants from the surface of the wafer. The hydrogen reacts with the contaminants on the hot surface reducing them to gaseous compounds which are removed from the chamber.

If the energy is supplied by ion bombardment, the copper seed layer is exposed, for example, to a plasma. The plasma is generated in one embodiment of the present invention using an inert gas, such as argon along with reactive gases such as hydrogen and nitrogen. Alternatively, a hydrogen/nitrogen plasma can be employed along for bombarding the copper as well as providing for contaminant removal. The addition of the hydrogen provides for the removal of copper deposition byproducts such as carbon, oxygen, fluorine and the like, thereby reducing the resistivity of the copper seed layer and improving the adhesion of same.

BRIEF DESCRIPTION OF THE DRAWINGS

Further details of the present invention are explained with the help of the attached drawings in which:

FIG. 5 depicts a table of data comparing the resistivity and adhesion of films processed under various conditions including and method of the present invention.

To facilitate understanding, identical reference numerals have been used, where possible, to designate identical elements that are common to the figures.

DETAILED DESCRIPTION

Figure 1:
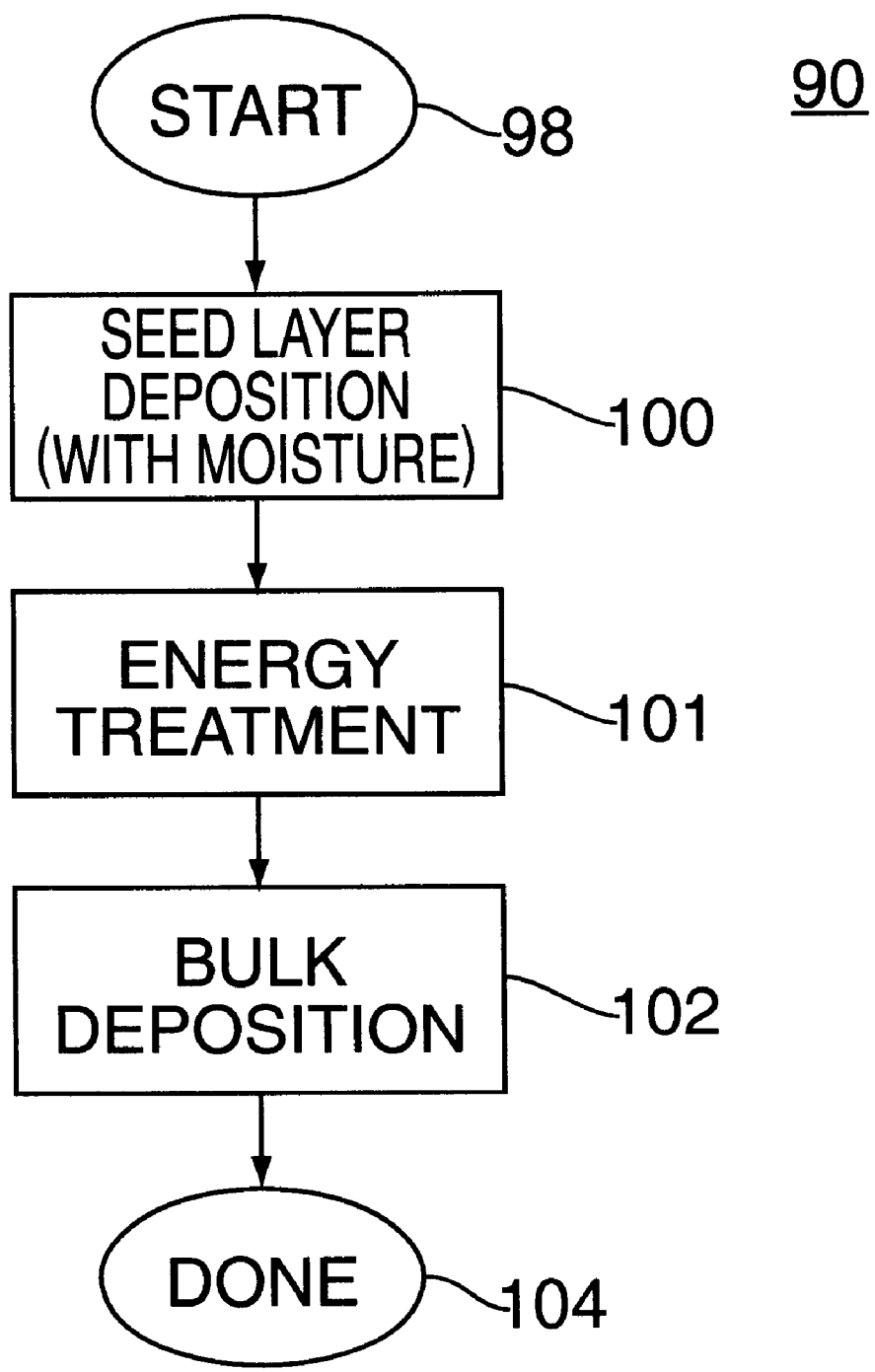
FIG. 1 illustrates a sequence of operations that are performed for depositing a layer of copper in accordance with the present invention.

FIG. 1 illustrates a sequence of operations 90, starting at step 98, in accordance with the present invention for depositing copper on the surface of a wafer mounted on a support in a vacuum chamber. A seed layer of moisture containing copper is deposited on the upper surface of the wafer in step 100. The seed layer of copper is deposited using chemical vapor deposition and can be deposited as either a continuous or discontinuous layer of copper. In accordance with the present invention, a Cu(hfac)L (Cupraselect) precursor is employed in the deposition of the seed layer. However, other copper precursors in combination with reducing agents could be used to form the seed layer, e.g., $Cu^{+2}$ (hfac)L precursor with a hydrogen reducing agent. An inert carrier gas, such as argon, Xenon, Krypton or Helium, that contains water vapor is also employed to introduce the moisture into the copper layer.

In a first embodiment of the present invention, the seed layer is treated with energy in the form of heat in step 101. The heat can be provided by various methods known in the art of semiconductor fabrication, for example a resistive heater element internal to the wafer support or heat lamps external to the wafer support.

In a second embodiment of the present invention, the seed layer of moisture containing copper is treated with energy in the form of a plasma. The plasma is generated by applying energy to one or more gases. In a preferred embodiment of the present invention, RF energy is used to produce the plasma gas composed of argon, hydrogen and nitrogen. Alternately, other inert gases such as krypton and xenon may be substituted for argon.

During plasma treatment, the substrate onto which the copper has been deposited acquires a negative bias as a result of electron bombardment. The bias results in positive ions in the plasma being accelerated toward the substrate. These ions impact the copper seed layer, thereby causing the copper to adhere to the surface of the substrate, i.e., the copper grains become "mounted" on the substrate and also flattens the grains to improve charge mobility. This enhances the adhesion of the copper seed layer to the substrate. Also, the hydrogen ions present in the plasma combine with precursor contaminant byproducts and are removed from the chamber.

Once the heat or plasma treatment is completed in step 101, a bulk deposition of copper is performed in step 102. The copper deposited during the bulk deposition is deposited over the treated copper to form a layer of copper having a desired thickness and improved adhesion to the wafer's surface. The bulk copper deposition is achieved using a chemical vapor deposition with Cupraselect or some other bulk copper deposition process. Furthermore, it is important that the bulk deposition of copper be performed in a moisture free environment. Finally, the process ends at step 104.

In one embodiment of the present invention, the seed layer and bulk layer depositions and heat or plasma treatment are performed in different chambers. Regardless of the type of treatment the seed layer is subjected to, it is speculated that the excess moisture from the Cu lattice is annealed out and oxides that may form as a result of oxygen reacting with pure copper are reduced and exhausted from the chamber by the hydrogen. As such, there are fewer contaminants left in the seed layer to effect resistivity and adhesion of the bulk layer to the seed layer. Alternately, the copper seed layer deposition, plasma treatment, and bulk deposition are accomplished in a single chamber that is capable of performing both chemical vapor deposition and plasma treatment and explained in greater detail below. Any moisture in the chamber may be removed, for example, by baking out the chamber prior to bulk deposition. Accordingly, the layer of copper is formed completely in situ.

Figure 2A:
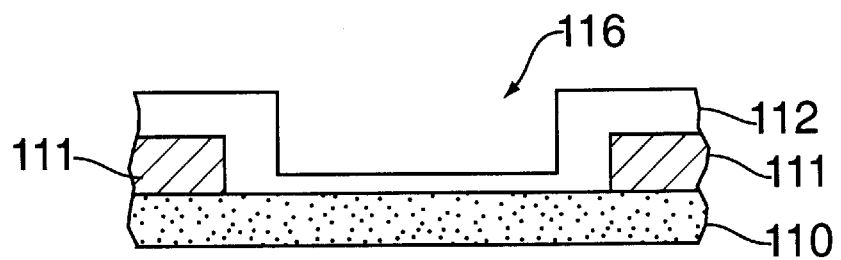
FIGS. 2(a)–2(d) illustrate the deposition and treatment of a layer of copper in accordance with the present invention.

FIGS. 2(a)–2(d) illustrate the formation and treatment of a layer of copper in an integrated circuit in accordance with the present invention. FIG. 2(a) shows a via 116 that has been formed (i.e., etched) in a layer 111 of insulative material, such as silicon dioxide. The layer 111 of insulative material overlies a substrate 110 which is to be electrically coupled to other elements in the integrated circuit. The substrate 110 is to be coupled to the other elements by an interconnect structure that will be formed within the via 116.

The upper surface of the insulative layer 111 and the upper surface of the substrate 110 that is within the perimeter of the via 116 are overlain by a diffusion barrier 112. The diffusion barrier 112 is employed to inhibit the diffusion of interconnect structure metal into the substrate 110. In one embodiment of the present invention, the interconnect structure metal is copper, and the diffusion barrier is a refractory metal or refractory metal nitride. For example, the refractory metal nitride is preferably tantalum nitride, but may also be titanium nitride, tantalum, tungsten nitride or another suitable material that functions as a diffusion barrier between the metal (e.g., copper) and the substrate 110.

Figure 2B:
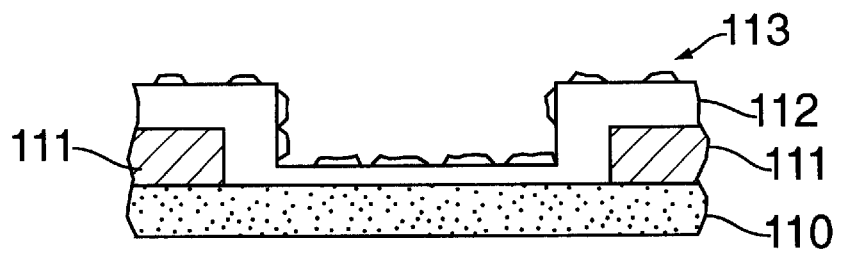

FIG. 2(b) illustrates the deposition of a seed layer 113 of copper which is to be employed in an interconnect structure. The seed layer of copper 113 is deposited on the upper surface of the diffusion barrier 112 using chemical vapor deposition. In one embodiment of the present invention, as shown in FIG. 2(b), the seed layer 113 of copper is deposited to be discontinuous, i.e., there are gaps between deposition regions. In an alternate embodiment (not shown) the seed layer 113 of copper is deposited to be continuous with a thickness in a range of 10 Å to 300 Å.

The chemical vapor deposition of the seed layer 113 is preferably achieved using the Cu(hfac)L precursor, with L being VTMS. Liquid Cu(hfac)L is vaporized and flowed into a deposition chamber containing the substrate 110 with diffusion barrier 112. Vaporization of the precursor can be accomplished by "bubbling" a carrier gas such as nitrogen, helium or hydrogen through the liquid precursor.

Moisture ($H_2O$) is added using an inert carrier gas, such as argon. The wafer is heated causing the precursor to react, as in equation 1 above, thereby depositing copper on the diffusion barrier 112. The seed layer 113 may be chemically deposited using other copper precursors such as $Cu^{+2}$ (hfac)$_2$ with a hydrogen reducing agent. Broadly speaking, any form of copper deposition with moisture is considered to be within the scope of the invention. During deposition, excess moisture ($H_2O$ vapor) exists in the seed layer. Additionally, some of the $H_2O$ may break down into $H_2$ and O (oxygen). The free O then combines with the seed layer to form copper oxide (CuO). CuO increases the resistivity of the seed layer as well as reduces adhesion of a bulk copper layer formed thereupon.

According to the first embodiment of the invention, after the seed layer of copper 113 is deposited, it is treated with heat in either a hydrogen or Argon atmosphere. This heat treatment anneals out the moisture ($H_2O$ vapor) in the seed layer. In addition, copper oxide (CuO) in the seed layer is reduced by reaction with the ambient hydrogen according to the following equation:

$$CuO + H_2 \rightarrow Cu + H_2O \quad \text{(Eqn. 2)}$$

the $H_2O$, in the form of water vapor, is exhausted from the chamber.

Figure 2C:
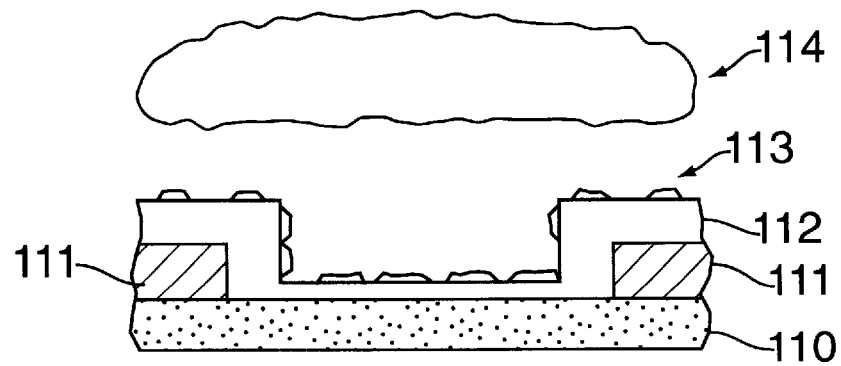

According to the second embodiment of the invention, after the seed layer of copper 113 is deposited, it is treated with a plasma 114, as shown in FIG. 2(c). In accordance with the present invention, the plasma 114 is formed by providing energy to one or more gases, i.e., a gaseous mixture, that includes an inert gas. Such inert gases include helium, argon, xenon and krypton. In one embodiment of the present invention, the gaseous mixture is composed of a mixture of argon, hydrogen and nitrogen.

The gas mixture is transformed into a plasma by infusing it with energy from a RF signal. A frequency of 13.56 MHz has been found to produce sufficient treatment results. Alternately, other frequencies include the range from approximately 350 kHz for low power applications and up to approximately 2 Ghz for microwave applications.

Figure 2D:
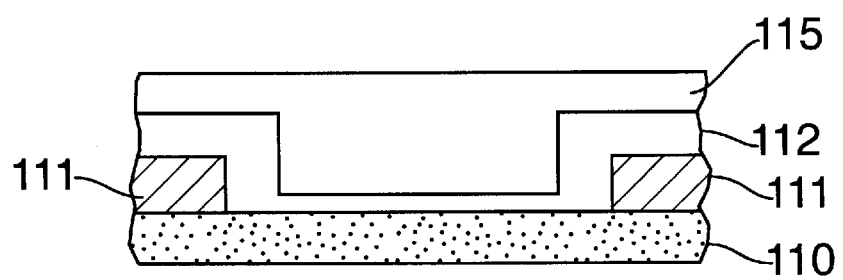

Once the seed layer of copper 113 is treated with heat or the plasma 114, a bulk deposition of copper is performed to form the final copper layer 115 having a desired thickness. As shown in FIG. 2(d), the newly deposited copper is deposited using chemical vapor deposition and merges with (grows upon) the seed layer of copper 113 to form the final layer of copper 115. In a preferred embodiment of the invention, the bulk CVD of copper layer 115 is achieved as described above with respect to FIG. 2(b) using the Cu(hfac)L precursor; however, no moisture is introduced and the bulk deposition is performed in a moisture free environment. Other moisture free bulk deposition processes may be used such as using $Cu^{+2}$ (hfac)$_z$ with a hydrogen reducing agent.

The bulk deposition of copper is accomplished until the final layer 115 of copper has a thickness in a range of 1000 Å to 1 micron. Since the newly deposited copper is deposited on top of the seed layer 113, which has improved adhesion to the underlying diffusion barrier 112, the adhesion of the final layer of copper 115 to the diffusion barrier 112 is also improved. As a result of the improved adhesion, the copper is less likely to be undesirably peeled away from the diffusion barrier 112 during CMP polishing.

In an alternate embodiment of the invention, substrate 110 could be a previously deposited layer of copper. Via 116 is typically etched through the insulative layer 111 with an Argon plasma. During this etching process, CuO can form on top of the copper substrate. Oxides such as CuO increase the resistivity and are therefore undesirable in a via fill application. Plasma treatment reduces CuO without copper sputtering onto and diffusing into the side walls of the via 116. In a preferred embodiment of the invention, a hydrogen/nitrogen plasma is used to treat the copper substrate, prior to the deposition of a titanium nitride barrier layer.

Specific preferred embodiments of the method of the present invention will now be discussed. Two copper films were deposited on separate titanium nitride diffusion barriers. For each film, a 100–300 Å thick seed layer of moisture laden copper was deposited in a CVD chamber. Following deposition of the seed layer, the wafers were transferred to a separate treatment chamber for treatment. The wafers were then transferred back to the CVD chamber for bulk layer deposition.

For the deposition of the seed layer, Argon was used as the carrier gas for moisture at a flow rate of approximately 26 sccm and hydrogen was introduced at a flow rate of approximately 100 sccm. Argon was also directed at the wafer backside and edge at a rates of approximately 200 sccm and 300 sccm respectively. A Cupraselect precursor was admitted to the CVD chamber at a rate of approximately 0.35 cc/min using helium as a carrier gas at a flow rate of approximately 200 sccm. The spacing between the showerhead and the wafer (heater spacing) was approximately 400 mils. The CVD chamber pressure was maintained at approximately 0.5 torr for a deposition time of approximately 30 sec. After deposition of the seed layer, one wafer was transferred to a treatment chamber and treated with heat and the other wafer was transferred to a treatment chamber and treated with an Argon/nitrogen/hydrogen plasma.

For the plasma treated wafer, a "self-annealing" stage is first established. In this stage, Argon, nitrogen, and hydrogen were admitted to the treatment chamber at flow rates of approximately 500 sccm, 250 sccm, and 250 sccm respectively. The heater spacing was maintained at 400 mils. The treatment chamber pressure was established at approximately 1.5 torr and treatment chamber temperature established at approximately 450° C. The wafer "self-annealed" for approximately 48 sec as the treatment chamber conditions stabilized prior to plasma treatment. After the self-annealing stage, plasma treatment conditions were established. Specifically, an RF signal was applied to the chamber at an approximate frequency of 13.56 Mhz and an approximate power of 450W to form the plasma. The plasma treatment conditions were sustained for approximately 60 sec.

For the heat treated wafer, hydrogen was admitted to the treatment chamber at a flow rate of approximately 1000 sccm. The treatment chamber pressure was established at approximately 5.0 torr and treatment chamber temperature established at approximately 450° C. The heater spacing was approximately 400 mils. The heat treatment conditions were sustained for approximately 300 sec.

For both the plasma and heat treated wafers, bulk copper was deposited in the CVD chamber using hydrogen flow of approximately 100 sccm and a Cupraselect precursor flow rate of approximately 0.35 cc/min using helium as a carrier gas at a flow rate of approximately 200 sccm. The argon carrier gas containing moisture was omitted during the deposition of the bulk films. Argon was directed at the wafer backside and edge at a rates of approximately 200 sccm and 300 sccm respectively. The heater spacing was approximately 400 mils. The CVD chamber pressure was established at about 0.5 torr and the deposition time was about 180 sec.

As an example of an alternate embodiment of the invention, a copper film was treated with a hydrogen/nitrogen plasma to strip CuO from a copper coated wafer without affecting the underlying copper. The process was performed in a TxZ chamber manufactured by Applied Materials of Santa Clara, Calif. Specifically, hydrogen and nitrogen were admitted to the CVD chamber at a flow rates of approximately 500 sccm and 100 sccm respectively. The chamber temperature was approximately 350° C. and the heater spacing was approximately 400 mils. Low frequency (approximately 350 khz) RF energy was applied at a power of approximately 155W and the chamber pressure was approximately 2.5 Torr. These treatment conditions were sustained for approximately 300 sec. This process left an interface of nearly pure copper upon which to deposit the next layer of the device, for example a barrier layer of titanium nitride or a bulk deposition of copper to fill the via.

A variety of wafers were processed under various conditions including those of the above described method. Table 1 shown in FIG. 5 depicts the results of five (5) representative wafers processed under different conditions. Wafers 2 and 3 (plasma treated only and heat treated only respectively) have the best combined characteristics of good adhesion, deposited layer thickness and low resistivity (1.7 $\mu\Omega\cdot cm$ is the standard for bulk copper, seed layers are usually slightly higher). Adhesion was measured by a qualitative "scotch tape" and scribe test. Adhesive tape was applied to the film and then peeled off. A score of 1 indicated the film peeled off at the interface between the copper and the barrier. A score of 2 indicated the film peeled off at the interface between the barrier and the underlying oxide. A score of 3 indicated the film didn't peel with the tape, but peeled when scribed. A score of 4 indicated none of the film peeled off with the tape or when scribed. An average score for four films is shown for each experiment.

Figure 3:
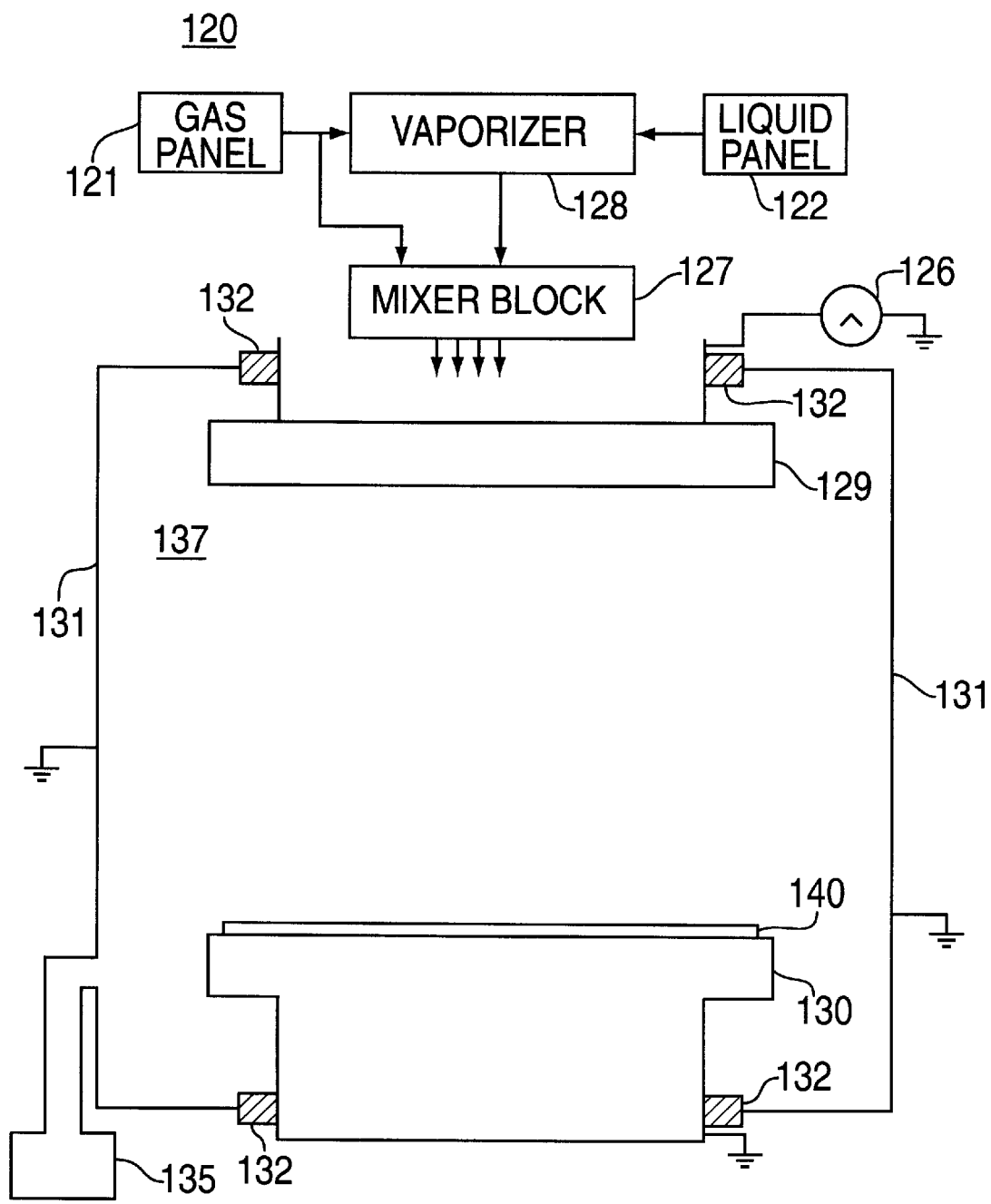
FIG. 3 illustrates a deposition chamber that is used in the deposition of copper in accordance with the present invention.

FIG. 3 illustrates a CVD system 120 that can be employed to form a layer of copper in accordance with the present invention. The chamber is a model WxZ chamber manufactured by Applied Materials, Inc. of Santa Clara, Calif., that has been modified to perform copper deposition in accordance with the invention. The system 120 includes a process chamber 137 in which copper deposition is performed. Included in the process chamber 137 are a wafer support 130 for supporting a wafer and a showerhead 129 for flowing process gases into the process chamber 137.

The process chamber 137 is defined by a set of walls 131 that are electrically and thermally isolated from the wafer support 130 and showerhead 129 by isolators 132. For providing thermal energy, the wafer support 130 includes a resistive coil (not shown) that provides heat to the wafer. For providing the energy for forming a plasma, the showerhead 129 is coupled to a signal source 126 that provides signals having frequencies in a range of 100 kHz to 20 MHz. Both the processing chamber walls 131 and the wafer support 130 are coupled to ground.

A pressure control unit 135, e.g., a vacuum pump, is coupled to the process chamber 137 for setting the pressure in the process chamber 137. The pressure control unit 135 also provides for purging reactant byproducts from the process chamber.

In order to provide reactants to the process chamber 137, the system 120 also includes a mixer block 127, vaporizer 128, gas panel 121, and liquid panel 122. The gas panel 121 provides carrier gases and reactants and is coupled to both the vaporizer 128 and the mixer block 127. The liquid panel 122 provides liquid reactants and is coupled to the vaporizer 128.

The vaporizer 128 provides for converting liquid reactants into gaseous reactants. When a liquid reactant is employed, the liquid panel 122 provides the liquid reactant to the vaporizer 128, and the vaporizer 128 vaporizes the liquid and uses an inert diluant gas such as helium, hydrogen, nitrogen or argon as a carrier gas. Alternatively, the vaporizer may produce a gaseous reactant through evaporation. When both gaseous and liquid reactants are employed, the gas panel 121 provides the vaporizer 128 with the carrier gases and gaseous reactants, and the liquid panel 122 provides the vaporizer 128 with the liquid reactants. The vaporizer then provides for the combination and vaporization of these reactants. The mixer block 127 is coupled to pass gaseous reactants from the gas panel 121 and vaporizer 128 to the showerhead 129.

A wafer 140 containing an upper surface on which copper is to be deposited is placed in the process chamber 137 on wafer support 130. In one embodiment of the present invention, the upper surface of the wafer 140 is a diffusion barrier that is formed by a refractory metal-based material, such as titanium nitride, tantalum nitride, tungsten nitride, titanium, tungsten and the preferred Tantalum. If the entire deposition process is not carried out in-situ, (i.e., the wafer is transferred to another chamber such as a treatment chamber , not shown) said treatment chamber may be identical in construction to the CVD chamber 137. Specifically, for providing energy for forming a plasma, the showerhead 129 is coupled to a signal source 126 that provides signals having frequencies in a range of 100 kHz to 20 MHz. Both the processing chamber walls 131 and the wafer support 130 are coupled to ground. During the plasma or heat treatment, the CVD chamber 137 would be pumped down to exhaust process by products and excess moisture from the chamber. The wafer would then be transferred back to the CVD chamber 137 from the treatment chamber.

Figure 4:
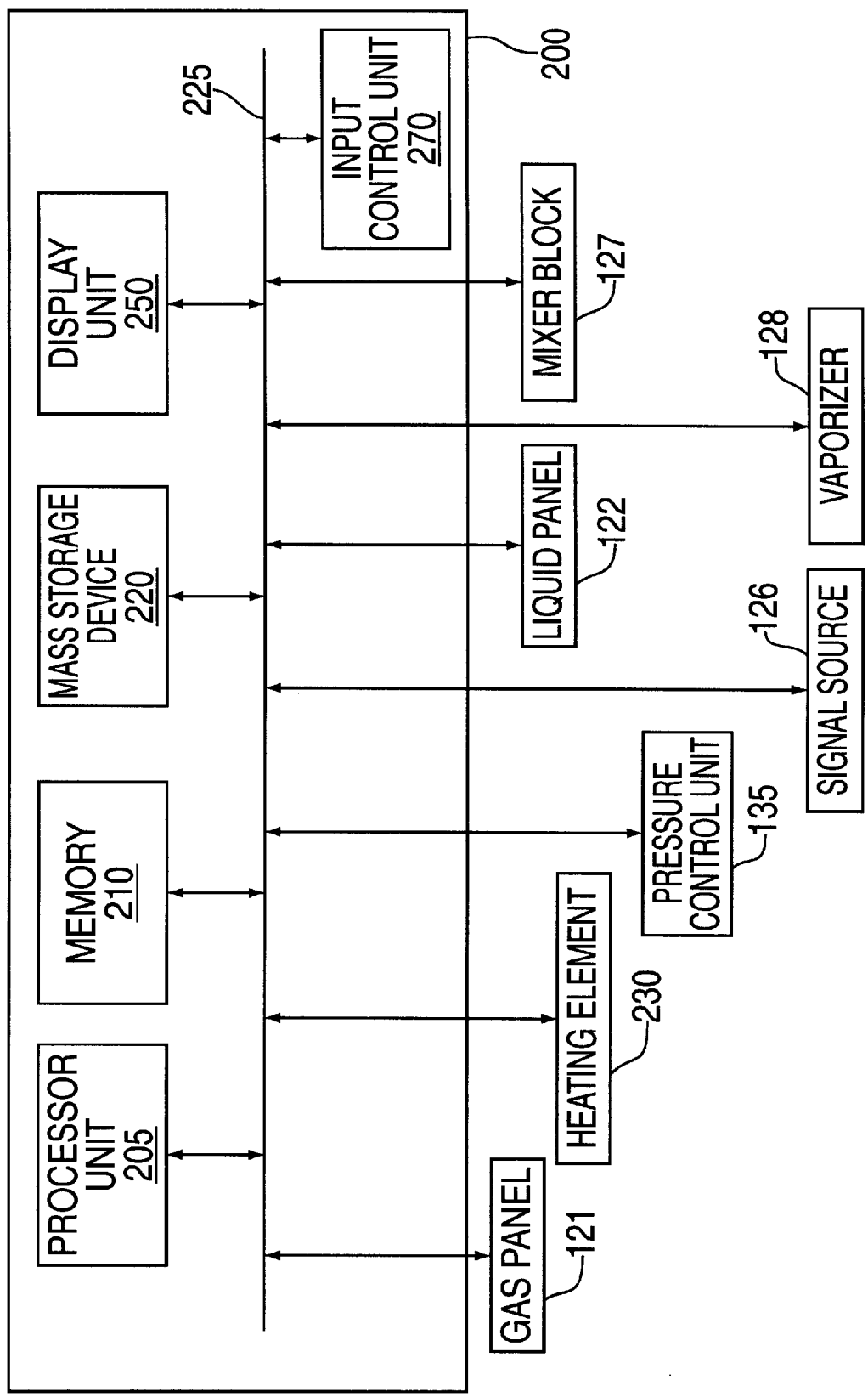
FIG. 4 illustrates a control system that is employed in accordance with the present invention to control the operation of a deposition chamber that is used for depositing copper in accordance with the present invention.

The above-described process steps (FIGS. 2(a) through 2(d)) for forming a layer of copper can be performed in a system that is controlled by a processor based control unit. FIG. 4 shows a control unit 200 that can be employed in such a capacity. The control unit includes a processor unit 205, a memory 210, a mass storage device 220, an input control unit 270, and a display unit 250 which are all coupled to a control unit bus 225.

The processor unit 205 is either a microprocessor or other engine that is capable of executing instructions stored in a memory. The memory 210 can be comprised of a hard disk drive, random access memory ("RAM"), read only memory ("ROM"), a combination of RAM and ROM, or another processor readable storage medium. The memory 210 contains instructions that the processor unit 205 executes to facilitate the performance of the above mentioned process steps. The instructions in the memory 210 are in the form of program code. The program code may conform to any one of a number of different programming languages. For example, the program code can be written in C+, C++, BASIC, Pascal, or a number of other languages.

The mass storage device 220 stores data and instructions and retrieves data and program code instructions from a processor readable storage medium, such as a magnetic disk or magnetic tape. For example, the mass storage device 220 can be a hard disk drive, floppy disk drive, tape drive, or optical disk drive. The mass storage device 220 stores and retrieves the instructions in response to directions that it receives from the processor unit 205. Data and program code instructions that are stored and retrieved by the mass storage device 220 are employed by the processor unit 205 for performing the above mentioned process steps. The data and program code instructions are first retrieved by the mass storage device 220 from a medium and then transferred to the memory 210 for use by the processor unit 205.

The display unit 250 provides information to a chamber operator in the form of graphical displays and alphanumeric characters under control of the processor unit 205. The input control unit 270 couples a data input device, such as a keyboard, mouse, or light pen, to the control unit 200 to provide for the receipt of a chamber operator's inputs.

The control unit bus 225 provides for the transfer of data and control signals between all of the devices that are coupled to the control unit bus 225. Although the control unit bus is displayed as a single bus that directly connects the devices in the control unit 200, the control unit bus 225 can also be a collection of busses. For example, the display unit 250, input control unit 270 and mass storage device 220 can be coupled to an input-output peripheral bus, while the processor unit 205 and memory 210 are coupled to a local processor bus. The local processor bus and input-output peripheral bus are coupled together to form the control unit bus 225.

The control unit 200 is coupled to the elements of one or more chambers, e.g., the CVD chamber 137 in FIG. 3 and a treatment chamber (not shown), that are employed in forming a layer of copper in accordance with the present invention. Each of these elements is coupled to the control unit bus 225 to facilitate communication between the control unit 200 and the element. These elements include the following: the gas panel 121, the liquid panel 122, a heating element 230, such as the resistive coil (not shown)in the wafer support, the pressure control unit 135, the signal source 126, the vaporizer 128, and the mixer block 127. The control unit 200 provides signals to the chamber elements that cause the elements to perform the operations described above for the process steps of forming a layer of copper.

In operation, the processor unit 205 directs the operation of the chamber elements in response to the program code instructions that it retrieves from the memory 210. In response to these instructions, the chamber elements are directed to perform the process steps described above with reference to FIG. 1.

Once a wafer is placed in the processing chamber, a seed layer of copper is deposited on the wafer in step 100 (FIG. 1). In order to perform the deposition in step 100, the processor unit 205 executes instructions retrieved from the memory 210. The execution of these instructions results in the elements of the chamber being operated to deposit a layer of material on a substrate as described above with reference to FIG. 2(*b*).

Once the seed layer of copper is deposited, instructions retrieved from the memory 210 instruct the processor unit 205 to cause the elements of the chamber 120 to perform an energy treatment in step 101. The execution of these instructions results in the wafer 140 being transferred to a treatment chamber, i.e., a similar CVD chamber available for the treatment process, and the elements of the treatment chamber being operated to treat the deposited copper with a plasma as described above with reference to FIG. 2(*c*).

Once the plasma treatment is completed, instructions retrieved from the memory 210 instruct the processor unit 205 to cause the elements of the chamber 120 to perform a bulk deposition of copper in step 102. The execution of these instructions results in the wafer 140 being transferred back to the chamber 120 from the treatment chamber and the elements of the chamber 120 being operated to perform a bulk deposition to treat the copper as described above with reference to FIG. 2 (*d*).

Although the present invention has been described in terms of specific exemplary embodiments, it will be appreciated that various modifications and alterations might be made by those skilled in the art without departing from the spirit and scope of the invention as specified by the following claims.

What is claimed is:

1. A method of reducing the resistivity of copper deposited on a substrate in a substrate processing system comprising the steps of:
   (a) depositing copper containing moisture upon said substrate; and
   (b) plasma treating the copper to reduce the resistivity of the copper, wherein the copper is "self-annealed" prior to being plasma treated.

2. The method of claim 1, wherein said plasma treatment step (b) comprises establishing plasma treatment conditions of admitting a hydrogen flow to a treatment chamber at a rate of approximately 1000 sccm, establishing a treatment chamber pressure at approximately 5.0 torr, a treatment chamber temperature at approximately 450° C. and a heater spacing of approximately 400 mils and sustaining said plasma treatment conditions for approximately 300 sec.

3. The method of claim 1, wherein the copper is "self-annealed" by providing an argon/nitrogen/hydrogen flow to a treatment chamber at flow rates of approximately 500 sccm, 250 sccm and 250 sccm respectively, establishing a treatment chamber pressure of approximately 1.5 torr, a treatment chamber temperature of approximately 450° C. and a heater spacing of approximately 400 mils and sustaining the "self-anneal" conditions for approximately 48 sec.

4. The method of claim 3, further comprising establishing plasma treatment conditions after the "self-annealing" step of applying an RF signal at an approximate frequency of 13.56 MHz and an approximate power of 450 W for approximately 60 sec.

5. The method of claim 1, further including the step of:
   (c) depositing copper without moisture upon the copper deposited in said step (a) and treated in step (b).

6. The method of claim 1, wherein the deposition step (a) is accomplished in a CVD chamber and the treatment step (b) is accomplished in a treatment chamber.

7. A method for forming a layer of copper over a layer of material formed on a wafer, said method comprising the steps of:
   (a) placing the wafer in a processing chamber;
   (b) chemical vapor depositing the copper with moisture on the layer of material;
   (c) transferring the wafer to a treatment chamber, wherein the copper is "self-annealed"; and
   (d) plasma treating the copper to reduce resistivity.

8. The method of claim 7, wherein said plasma treatment step (d) comprises establishing plasma treatment conditions of admitting a hydrogen flow to a treatment chamber at a rate of approximately 1000 sccm, establishing a treatment chamber pressure at approximately 5.0 torr, a treatment chamber temperature at approximately 450° C. and a heater spacing of approximately 400 mils and sustaining said plasma treatment conditions for approximately 300 sec.

9. The method of claim 7, wherein the copper is "self-annealed" by providing an argon/nitrogen/hydrogen flow to a treatment chamber at flow rates of approximately 500 sccm, 250 sccm and 250 sccm respectively, establishing a treatment chamber pressure of approximately 1.5 torr, a treatment chamber temperature of approximately 450° C. and a heater spacing of approximately 400 mils for approximately 48 sec. and subsequently applying an RF signal at an approximate frequency of 13.56 MHz and an approximate power of 450 W for approximately 60 sec.

10. The method of claim 7, further including the step of:
   (e) depositing copper on the copper deposited in said step (b), while the wafer is in a moisture free environment.

11. In a semiconductor wafer processing system containing a chamber for performing chemical vapor deposition and a computer for controlling said chemical vapor deposition within said chamber, a computer readable medium containing a program that, when executed by said computer, causes said semiconductor wafer processing system to perform the following steps:
   depositing a copper seed layer with moisture upon a substrate;
   supplying a treatment gas to said chamber, wherein the copper seed layer is "self-annealed" using said treatment gas; and
   plasma treating said copper seed layer using said treatment gas.

12. The computer readable medium of claim 11, further containing a program that, when executed by said computer, causes said semiconductor wafer processing system to perform the following additional step:
   depositing a layer of copper upon the copper seed layer.

13. A method for treating a layer of copper underneath an existing layer of material on a semiconductor wafer, processed in a semiconductor wafer processing system having one or more chambers, the method comprising the steps of:
   (a) etching a via through said existing layer of material to expose a portion of a surface of said layer of copper; and
   (b) plasma treating said surface of said layer of copper in the presence of hydrogen to reduce a copper oxide on said exposed portion.

14. The method of claim 13 wherein said plasma further comprises nitrogen.

15. The method of claim 14 wherein said plasma is provided by
   admitting a flow of hydrogen and a flow of nitrogen to one of the said one or more process chambers at rates of approximately 500 sccm and 100 sccm respectively;
   establishing a chamber temperature at approximately 350° C.;
   establishing a heater spacing at approximately 400 mils;
   establishing a chamber pressure of approximately 2.5 Torr;
   applying RF energy at a power of approximately 155W; and
   sustained said flows, temperature, heater spacing, pressure and RF energy for approximately 300 sec.

16. The method of claim 13 further comprising the step of
   (c) depositing material onto said existing layer and said exposed portion.

* * * * *

UNITED STATES PATENT AND TRADEMARK OFFICE
CERTIFICATE OF CORRECTION

PATENT NO. : 6,319,728 B1
DATED : November 20, 2001
INVENTOR(S) : Bhan et al.

It is certified that error appears in the above-identified patent and that said Letters Patent is hereby corrected as shown below:

Column 3,
Line 23, please replace "and" with -- the --.

Column 6,
Line 26, please replace "rates" with -- rate --.

Column 7,
Line 1, please replace "rates" with -- rate --.
Line 12, please replace "rates" with -- rate --.

Column 12,
Line 18, please replace "at" with -- of --.

Signed and Sealed this

Fourth Day of June, 2002

*Attest:*

*Attesting Officer*

JAMES E. ROGAN
*Director of the United States Patent and Trademark Office*